United States Patent
Dent et al.

(10) Patent No.: US 6,240,538 B1
(45) Date of Patent: May 29, 2001

(54) METHOD AND APPARATUS FOR ERRORS AND ERASURES DECODING

(75) Inventors: Paul Dent, Pittsboro, NC (US); Amer Hassan, Kirkland, WA (US); Wayne Stark, Ann Arbor, MI (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/150,526

(22) Filed: Sep. 10, 1998

(51) Int. Cl.$^7$ .......................... H03M 13/27; H03M 13/45
(52) U.S. Cl. ........................................... 714/762; 714/780
(58) Field of Search .................................. 714/756, 761, 714/762, 780

(56) References Cited

U.S. PATENT DOCUMENTS

| | | |
|---|---|---|
| 4,653,052 | 3/1987 | Doi et al. . |
| 4,835,772 | 5/1989 | Peile et al. . |
| 5,299,208 | 3/1994 | Blaum et al. . |
| 5,471,503 | 11/1995 | Altmaier et al. . |

FOREIGN PATENT DOCUMENTS

| | | |
|---|---|---|
| 0 240 363 A2 | 10/1987 | (EP) . |
| 0 323 606 A2 | 7/1989 | (EP) . |
| 0 677 937 A1 | 10/1995 | (EP) . |
| 101981 | 3/1998 | (EP) . |

OTHER PUBLICATIONS

Wayne E. Stark, *Coding for Frequency–Hopped Spread–Spectrum Communication with Partial–Band Interference–Part II: Coded Performance*; IEEE Transactions on Communications, vol. COM–33, No. 10, Oct. 1985, pp. 1045–1057.

John M. Wozencraft and Irwin M. Jacobs, *Principles of Communication Engineering*; Department of Electrical Engineering, Massachusetts Institute of Technology; John Wiley & Sons, Inc., New York.

Wayne E. Stark, *Capacity and Cutoff Rate of Noncoherent FSK with Nonselective Rician Fading*; IEEE Transactions on Communications, vol. COM–33, No. 11, Nov. 1985, pp. 1153–1007.

Danny T. Chi, *A New Block Helical Interleaver*; Kodak Berkeley Research, 2120 Haste Street, Berkeley, CA 94704; 0–7803–0585–X/92; 1992 IEEE, pp. 0799–0804.

Arnold M. Michelson and Allen H. Levesque, *Error–Control Techniques for Digital Communication*; GTE Government Systems Corporation, Needham Heights, Massachusetts; A Wiley–Interscience Publication, John Wiley & Sons, New York, pp. 160–162; 204–208.

Baum et al., "Erasure Inserion via the Ratio–Threshold Test in Frequency–Hop Multiple–Access Radio Networks with Partial–Band Interference", IEEE CH2831–6/90/ 0000–0603, 1990, pp. 603–607, Dec. 1990.*

* cited by examiner

*Primary Examiner*—Stephen M. Baker
(74) *Attorney, Agent, or Firm*—Jenkens & Gilchrist, P.C.

(57) ABSTRACT

A method for coded transmission of data is disclosed. A first code word interleaved in a first plurality of burst transmissions is recovered for further processing. The recovered code word is decoded to correct and identify any errors within the code word. Using the results of the above-decoding, bad burst transmissions are identified and erased. Subsequently, a second code word interleaved within a second plurality of burst transmissions is recovered. The second plurality of burst transmissions includes the erased burst transmissions from the first plurality of burst transmissions. The received second code word is then errors and erasures decoded.

22 Claims, 6 Drawing Sheets

METHOD AND APPARATUS FOR ERRORS AND ERASURES DECODING

BACKGROUND OF THE INVENTION

1. Technical Field of the Invention

The present invention relates to the use of errors and erasures decoding, and more particularly, to a method for determining the bits to be erased in an errors and erasures decoding system.

2. Description of Related Art

When digital data is wirelessly transmitted over physical channels, the physical channels may corrupt the transmitted digital waveform with additive noise and multipath fading resulting in occasional errors at the receiver. Reliable communications over fading channels requires a large bit energy to noise ratio. It is known that when communicating over a Rayleigh fading channel, the uncoded bit error rate (BER) decreases inverse linearly rather than exponentially with information bit energy to noise ratio $E_b/N_o$, both being plotted on a logarithmic scale. Fading can also cause a loss in capacity and reduce channel cutoff rate.

To compensate for the detrimental affects of channel fading and additive white gaussian noise, most communications systems use some form of error correction coding. Most of the losses incurred from channel fading can be recovered using error control coding with some optimally-selected coding rate. Coding involves the adding of redundancy to the transmitted sequence to enable the receiver to correct for errors.

A method for protecting against channel fading and noise using error correction decoding is the use of errors and erasures decoding. In a TDMA communications system, users are assigned timeslots containing a number of data symbols for transmission. If the system uses some form of error correction coding, it is desirable to obtain information concerning the reliability of the symbols in a particular timeslot, erase unreliable symbols and use errors and erasures correction decoding to decode the information. The error correcting capability of channel codes is determined by two factors; the code weight (or distance) distribution of the code and the decoding algorithm. For a code with a minimum Hamming distance d, the decoder can correct all error patterns if the number of errors e satisfies the inequality $2e \leq d-1$. However, the code can also correct all error patterns and erasure patterns if the number of errors e and erasures $\gamma$ satisfy the inequality $2e+\gamma \leq d-1$.

In a hypothetical limit wherein all errors occurring within the received message could be identified and erased before decoding (i.e., e becomes 0), the erasure correcting capability of a particular code using erasures decoding mode would be effectively doubled over the error correcting capability of the same code using error decoding. In practice, not all errors within a received message can be identified with certainty. Thus, it is highly desirable to develop erasure techniques for indicating whether a demodulated symbol is reliable, enabling erasure of the unreliable symbol prior to decoding. The decoder is then able to correct twice as many identified erasures as random, unidentified errors.

Additional techniques for obtaining reliability information about a channel having coded communications generally include pre-detection techniques and post-detection techniques. Pre-detection techniques attempt to determine, for example, signal to noise or interference ratio, but this is difficult in an environment where the noise and interference fade up and down as well as the signal. In a frequency hopping system the technique has been used to generate reliability information concerning a particular hop or burst by deeming a hop to contain interference if its signal strength is unusually high. This illustrates that the interpretation of high signal strength as high quality is not always valid. All post-detection methods for erasures described in the prior art involve making hard decisions on test bits, thus resulting in a loss of performance, as "hard" decisions are known to give poorer decoding than "soft" decisions.

SUMMARY OF THE INVENTION

The present invention comprises a method for coded transmission of data between a transmitter and a receiver. Initially, at the transmitter, a first and second plurality of burst transmissions are generated. Each of the first and second plurality of burst transmissions include a first and a second code word of information symbols interleaved therein, respectively. The burst transmissions are transmitted to the receiver where the first plurality of burst transmissions are deinterleaved to extract the symbols of the first code word therefrom. The first code word is then subjected to errors-only decoding to identify and correct any errors within the code word. From the error decoding process, the likely location of bad symbols within the first plurality of burst transmissions are identified and symbols are labeled as erasures.

The second plurality of burst transmissions may then be deinterleaved to extract the symbols of second code word. The second plurality of burst transmissions will include the symbols labeled as erasures with the aid of the first plurality of burst transmissions. Errors and erasures decoding may then be performed on the extracted second code word. The new errors are identified and used to indicate the likely location of bad symbols in a third codeword, and so forth. This method of errors and erasures decoding will assist in providing improved error correction of received signals in a bursty transmission environment.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

Figure 1:
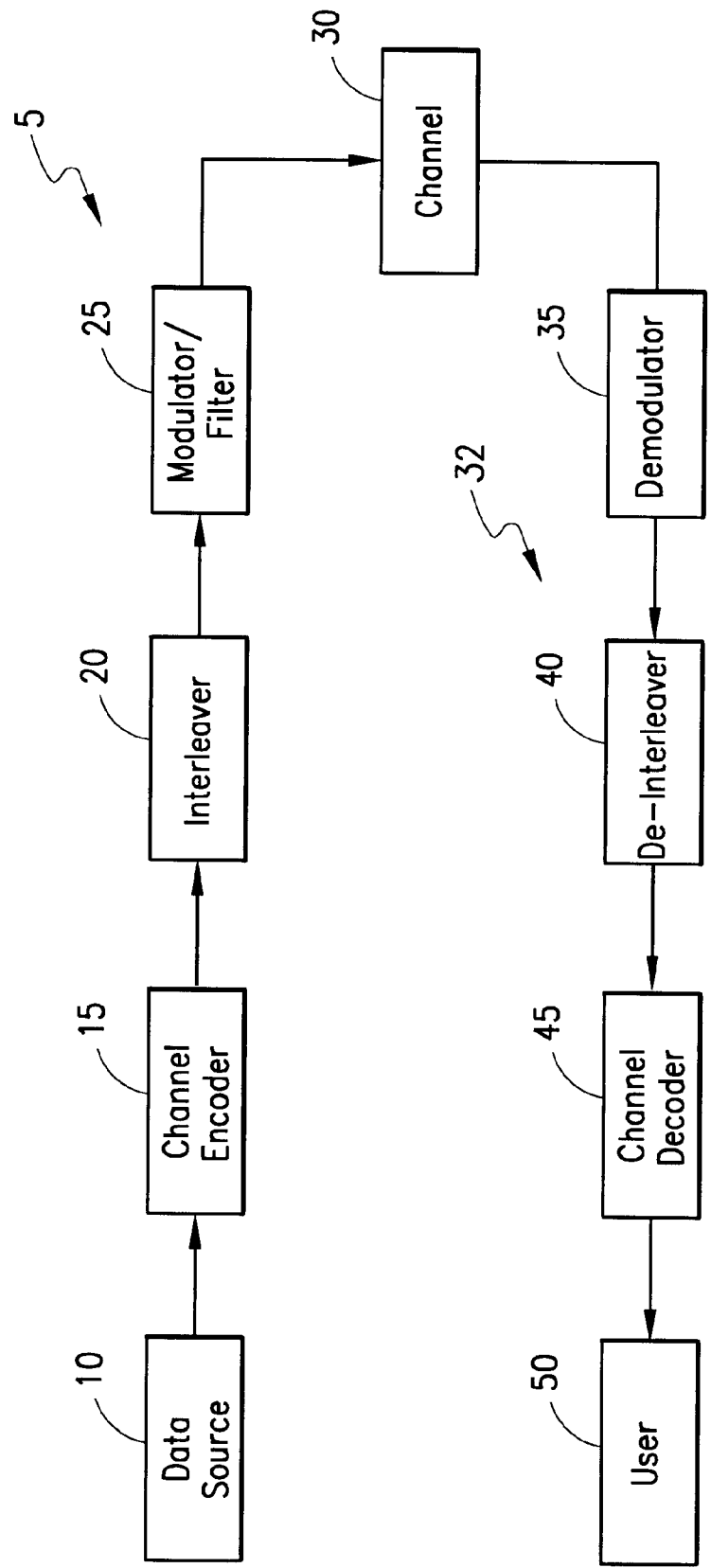
FIG. 1 is a block diagram of a coded digital communications system.

Referring now to the drawings, and more particularly to FIG. 1, there is illustrated a communication system for transmitting encoded digital communication signals in which the method of the present invention may be implemented. The transmitter portion 5 of the system includes a data source 10 and a channel encoder 15 for encoding digital data bits or symbols to be transmitted. Interleaving is performed by an interleaver 20 prior to modulation to reduce the correlation between successive coded bits and thus improve performance of the error correction decoder within a receiver. A modulator 25 modulates the encoded and interleaved data symbols and transmits the symbols over a noisy channel 30.

The encoded, interleaved and modulated symbols are preferably transmitted using a time division multiple access (TDMA) protocol. In the TDMA system the symbols are transmitted in frames, and each frame includes multiple timeslots. Within TDMA, a communication channel is defined as one or more timeslots in each frame which are assigned for use by a communicating transmitter 5 and receiver 32. Each timeslot contains numerous encoded bits or symbols. Each successive timeslot may furthermore be transmitted on a randomly selected frequency (frequency hopping). However, it should be appreciated that the present invention is applicable to other communication protocols, such as CDMA or FDMA, as well.

At the receiver 32 the received signal is first demodulated by demodulator 35. The demodulated signal is processed by deinterleaver 40 to deinterleave the transmitted frames and to reinstate successively coded symbols such that they are once more adjacent. Decoding is performed by a channel decoder 45 and decoded data is forwarded to a user 50. The interleaver/deinterleaver components utilize block diagonal interleaving/deinterleaving where each block of coded data (also referred to as a code word) is partitioned into M subblocks transmitted in M distinct TDMA burst transmissions. Likewise, each transmitted burst includes N subblocks from N distinct code words.

Figure 2:
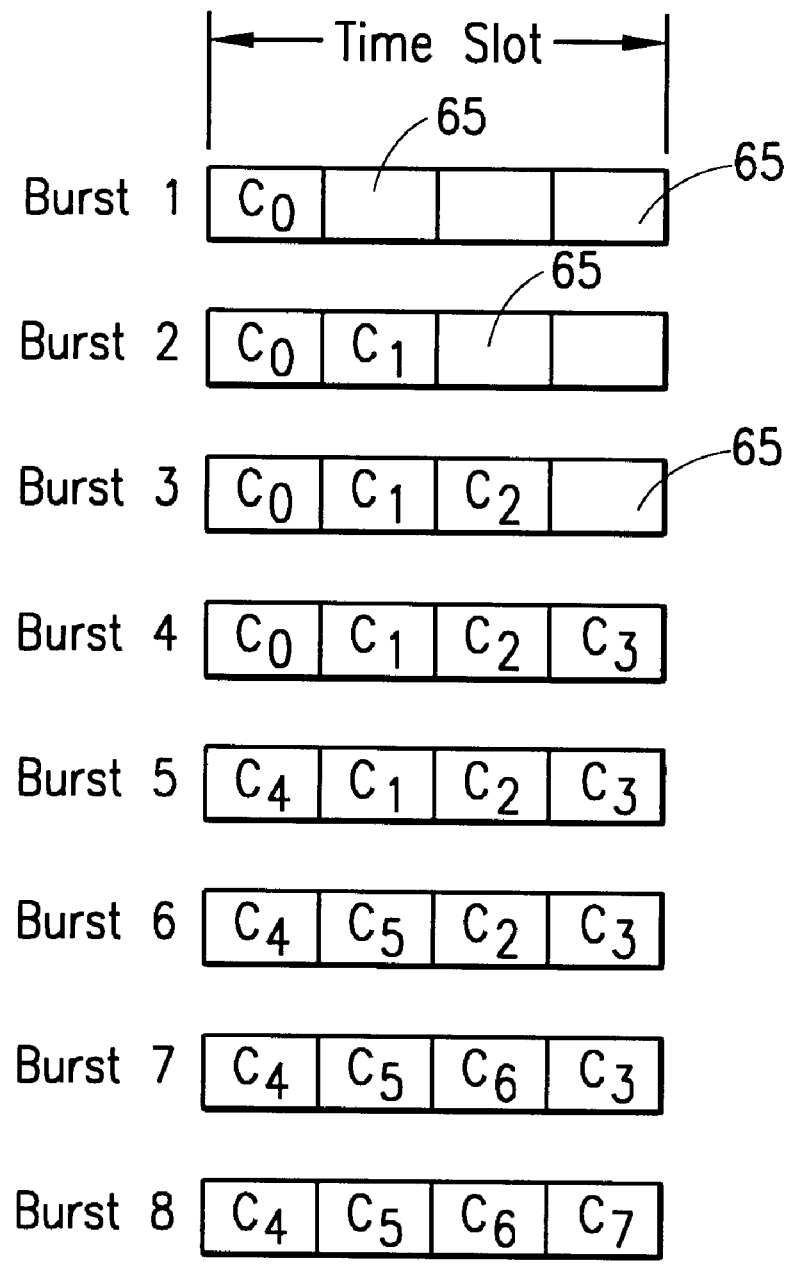
FIG. 2 is an illustration of a number of burst transmission including one or more code words.

In the preferred embodiment of the present invention, illustrated in FIG. 2, four code words are block-diagonally interleaved across four timeslots. In FIG. 2, subblocks belonging to the same codeword are each represented by the same representation $C_x$. Thus, the code word $C_0$ is transmitted over bursts 1–4 while code word $C_1$ is transmitted over bursts 2–5. At the beginning of a communication, the first TDMA burst transmission only includes contributions from the first code word $C_0$. The remainder of the bits 65 belong to previously decoded codewords. The second burst includes contributions from two code words $C_0$ and $C_1$, and the remainder of the bits belong to previous codewords. The third burst includes three code words ($C_0$,$C_1$,$C_2$), and the remaining portion consist of previous codewords. Finally, within the fourth burst transmission, and those following, the entire burst is filled with four subblocks as yet undecoded code words. While the embodiment of FIG. 2 illustrates one fourth of four code words interleaved into each burst, any portion or number of code words may be interleaved into a burst in accordance with the teachings of the present invention.

Figure 3:
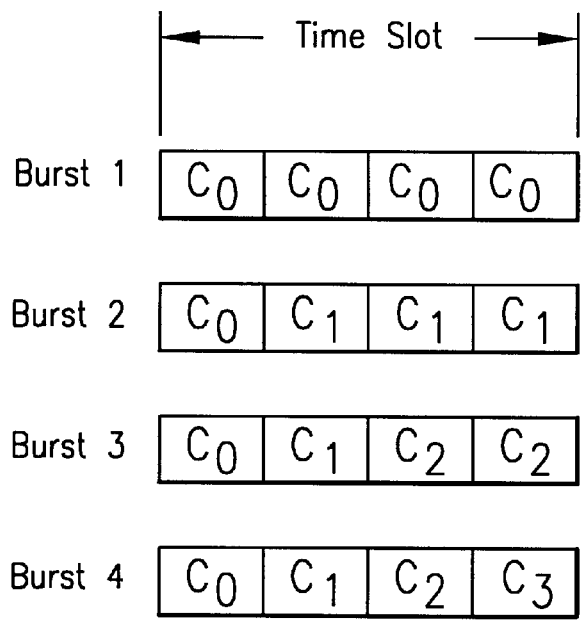
FIG. 3 is an illustration of an alternative embodiment for including code words within the first three burst transmissions of a coded transmission.

Referring now to FIG. 3, there is illustrated an alternative embodiment, wherein no previously transmitted codewords exist to fill the first three bursts, additional redundancies rather than previous bits 65 may be incorporated. The purpose of this is to enhance the initialization of the decoding process. This is particularly important in voice transmissions where transmissions are discontinued during periods of silence and then resumed when speech activity recommences. The redundancy is preferably implemented by a simple repetition coding wherein burst 0 includes data from code word $C_0$ repeated four times, burst 1 includes data from code word $C_1$ repeated three times, and burst two includes data from code word $C_2$ repeated twice. From this point on, four code words are included within a aburst as described previously. The redundancy coding makes use of unused bits in the initial transmission phase. Receiving the repeated coding is done using simple energy combining. More sophisticated coding may be used in place of repetition coding, however this results in additional complexity at the receiver unit 32.

Figure 4:
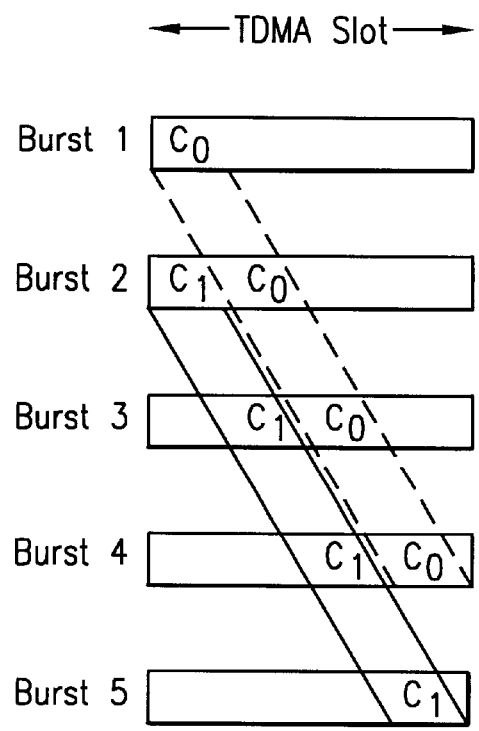
FIG. 4 is an illustration of one method for diagonally interleaving code words into timeslots within a plurality of burst transmissions.

FIG. 4 illustrates one embodiment of the present invention wherein each code word $C_x$ is block diagonally interleaved across four timeslots. Thus, each timeslot within this embodiment would include one-fourth of the code symbols from four separate code words, and each code word would be transmitted in four consecutive bursts. At the deinterleaver 40, the received code words are deinterleaved in a similar manner and reassembled from four separate bursts into the originally generated code word.

Figure 5:
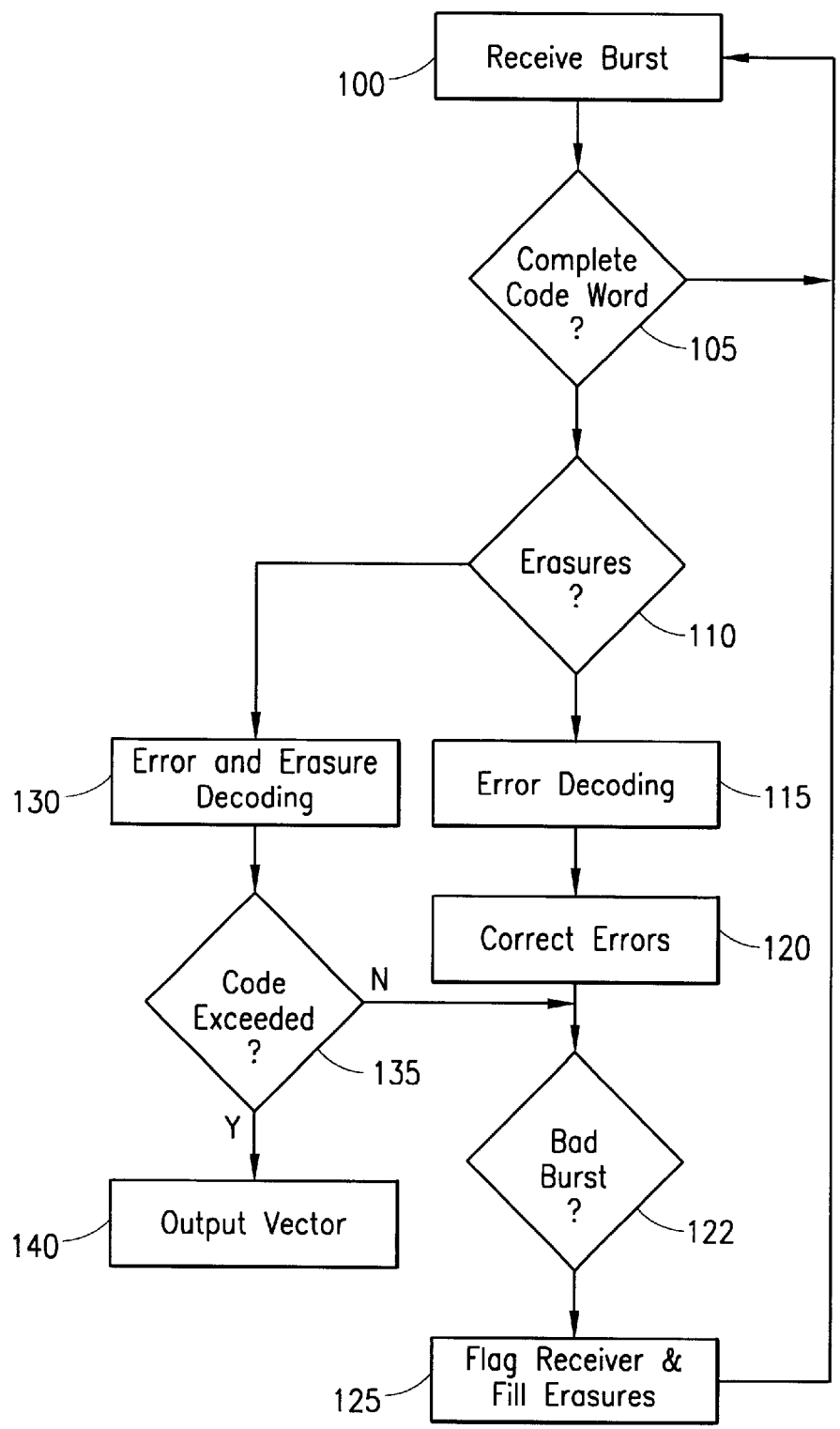
FIG. 5 is a flow diagram of a method for errors and erasures decoding within a bursty transmission system.

Referring now to FIG. 5, there is illustrated a flow diagram of the method of the present invention for implementing errors and erasures decoding within the decoder 45. Initially at step 100, the receiver 32 will receive a demodulated burst transmission for decoding. Inquiry step 105 determines if a complete code word has been received, and if not, returns control to step 100 to receive the next burst transmission. As mentioned previously, each code word is divided among several burst transmissions and in the preferred embodiment of this invention over four burst transmissions. The procedure will only cycle through step 105 more than once during initialization of a burst transmission procedure. After that, reception of each new burst would generally complete a new codeword. In the case of a code word divided over four separate burst transmissions, once the first three burst transmissions are received, each successive burst transmission will provide a completed code word. Once the complete code word has been assembled from M burst transmissions, inquiry step 110 determines if any erasures have been previously flagged or filled. If not, error decoding of the completed code word occurs at step 115.

Errors detected within the decoded code word are corrected at step 120. By observing the distribution of errors across the bursts containing a code word, the receiver produces useful information as to the reliability-distribution of information carried in the bursts. If inquiry step 122 determines that most of the errors in just-decoded (and later and previously decoded) code words were found to be located in a particular burst, this burst is judged unreliable for the purposes of decoding further code words, and the contents of the burst are replaced by erasures. The erased bits may also be replaced with soft value bits. The receiver is flagged that the burst is bad at step 125. Alternatively, a burst may be identified as bad at step 122 based upon some threshold number of detected errors within the decoding process.

After identifying the erasures or if a bad burst is not detected, control passes back to step 100 to receive the next burst transmission. This burst transmission will complete the next code word as determined by step 105, and inquiry step 110 will detect erasures arising from the previously decoded code word. Due to the previous erasures the next code word will be decoded using errors and erasures decoding at step 130, rather than just utilizing error decoding at step 115. In errors and erasures decoding, a decoder is presented with a sequence consisting of hard decisions (such as 0 and 1 for binary symbols) as well as, erasures or "don't knows". The decoder has the task of deciding which of a number of code words is most likely to have been transmitted based upon the received hard decision symbols and the erasures. A suitable algorithm for errors and erasures decoding is the Berlekkamp-Massey bounded distance coding algorithm. However, it should be appreciated that other decoding algorithms may be utilized. If the errors and erasures correcting capability of a particular code or codes is exceeded as determined by inquiry step 135, the decoder fails and the receiver outputs the information symbols of the vector received from the modulator, including errors and erasures. The method may equally be applied when the demodulator demodulates symbols to provide soft decisions. A soft decision indicates the degree of "1" ness or "0" ness in the care of a binary symbol. For example, on a scale of −100% (for a perfect "0") to +100% (for a perfect "1"), an erasure or "don't know" is indicated by a 0% soft decision.

Figure 6:
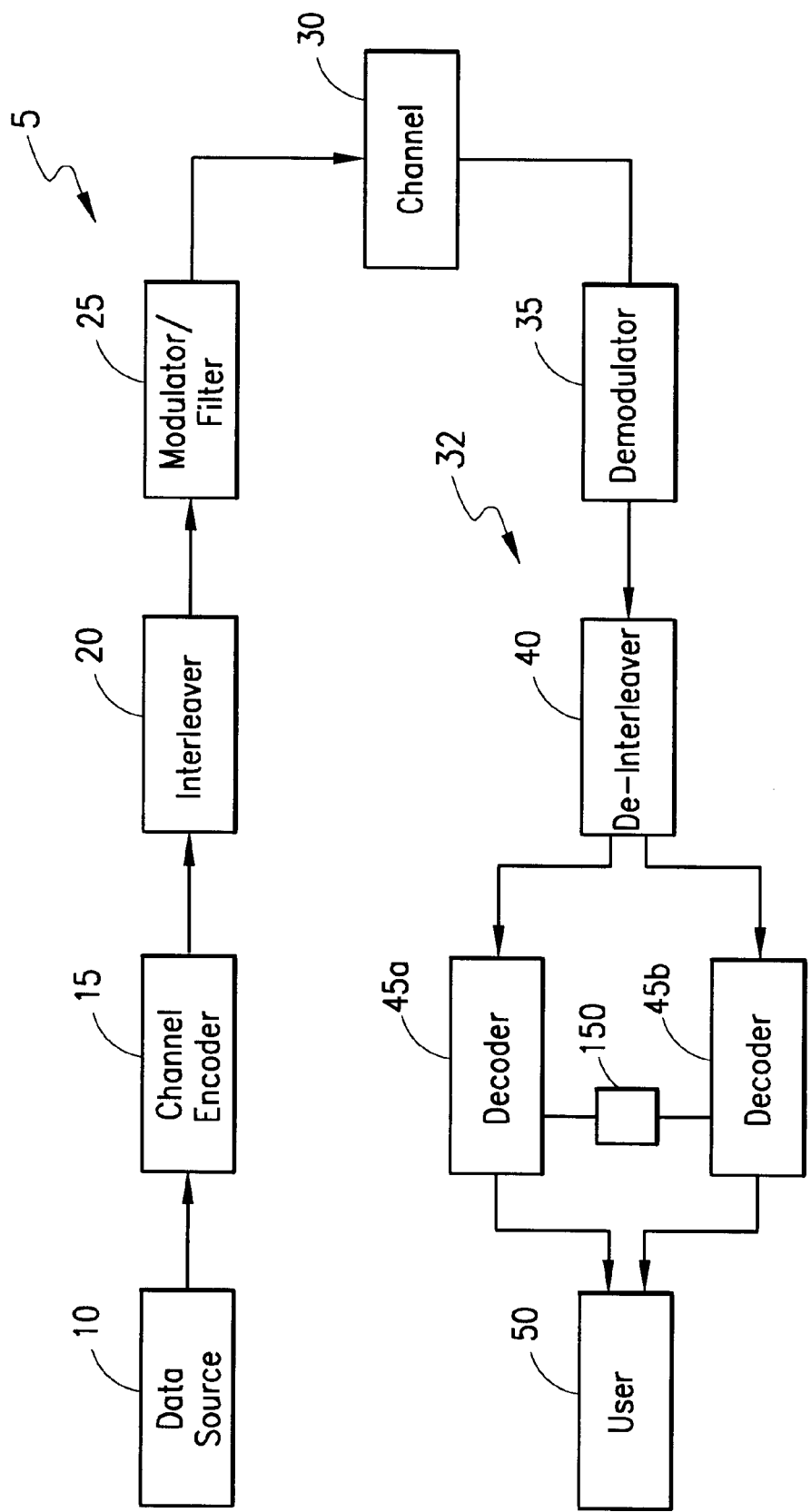
FIG. 6 is a block diagram of an alternative embodiment of the invention.

In an alternative embodiment illustrated in FIG. 6, rather than utilizing a single channel decoder 45 as illustrated in FIG. 1, two decoders 45A and 45B may be used in parallel. The first decoder 45A performs solely error correction decoding processes, while the second decoder 45B performs errors and erasures decoding. A selector 150 chooses the output of one of the two decoders. In this embodiment, when the errors and erasures decoder 45B fails to decode because the error and erasure correcting abilities of the code have been exceeded, the error correction decoder is selected by selector 150 to decode the received signal. If both decoders fail, the receiver outputs the information symbols of the received vector 140, including errors and erasures.

Figure 7:
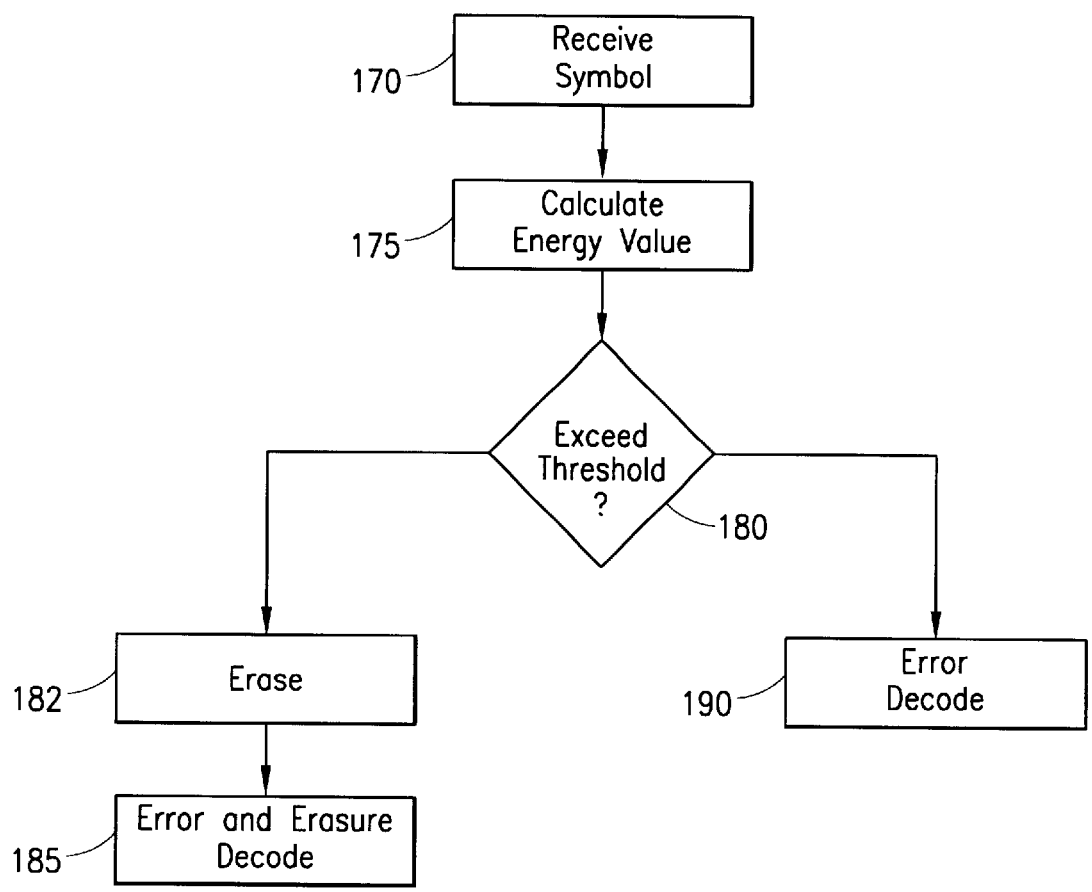
FIG. 7 is a flow diagram illustrating an alternative method for using errors and erasures decoding within a bursty transmission system.

Referring now to FIG. 7, there is illustrated an alternative method for determining erasures. It is common and intuitive to conclude that if an estimate of the power of the received signal (for instance the output of a noncoherent method filter) for a received coded symbol is large than the symbol is highly reliable. Thus, if a coded symbol has a very small soft metric or log likelihood, that symbol can be declared as unreliable and erased. However, mobile systems are interference limited. Thus, a high energy value can be due to a strong interference. Therefore, if a coded symbol or collection of coded symbols have a much higher signal strength than neighboring symbols deemed to be reliable, these bits can be declared as unreliable and erased because it is very likely that the high received energy is due to interference.

FIG. 7 illustrates a flow diagram for an alternative method for determining erasure data. Initially, at step 170, a decoded symbol or group of symbols is received. The energy value of a single symbol or a group of symbols is calculated at step 175. If the coded symbol or collection of symbols has an unexpected signal strength in relation to neighboring signals or some other predetermined threshold level as determined at inquiry step 180, these symbols are declared unreliable and erased at step 182. Error and erasures decoding may then be performed on the symbols at step 185. If no symbols with an usually high or low signal strength are detected at inquiry step 182, error correction decoding is utilized at step 190.

Although a preferred embodiment of the method and apparatus of the present invention has been illustrated in the accompanying Drawings and described in the foregoing Detailed Description, it is understood that the invention is not limited to the embodiment disclosed, but is capable of numerous rearrangements, modifications, and substitutions without departing from the spirit of the invention as set forth and defined by the following claims.

What is claimed is:

1. A method for coded transmission of data, comprising the steps of:

recovering a first code word within a first plurality of burst transmissions;

error correction decoding the recovered first code word to correct errors within the code word;

identifying bad burst transmissions by determining a burst transmission containing a majority of errors identified by the decoding;

erasing at least a portion of the burst transmissions identified as bad;

recovering a second code word from a second plurality of burst transmissions, wherein the second plurality of burst transmissions includes the erased burst transmission from the first plurality of burst transmissions; and error and erasure decoding the second code word.

2. The method of claim 1 wherein the step of recovering a first code word comprises the step of deinterleaving the first plurality of burst transmissions to extract subblocks of the first code word from each burst transmission of the plurality of burst transmissions.

3. The method of claim 1 wherein the step of identifying further comprises the step of finding burst transmissions having more than a threshold number of errors.

4. The method of claim 1 wherein the step of identifying further includes the step of flagging erased bits within a burst transmission for identification in subsequent decoding processes.

5. The method of claim 1, further including the step of outputting a received vector, including error and erasures, if an errors and erasures correction capability is exceeded for a particular code word.

6. The method of claim 1, further including the step of switching to an error decoding process if an error and erasures correction capability is exceeded for a particular code.

7. The method of claim 6, further including the step of outputting a received vector, including errors and erasures, if error correction code capability is exceeded for a particular code word.

8. The method of claim 1, further including the step of generating a plurality of burst transmissions, wherein each burst transmission in the plurality of burst transmissions include a portion of an entire code word.

9. The method of claim 8 wherein the step of generating further includes the step of interleaving the first code word within the first plurality of burst transmissions.

10. The method of claim 1 wherein the burst transmission in the plurality of burst transmissions includes a code word and at least one stuffed bit.

11. The method of claim 1 wherein a burst transmission in the plurality of burst transmissions includes a code word repeated a plurality of times.

12. The method of claim 1 wherein the plurality of burst transmission comprise a group of symbols.

13. The method of claim 1 further including the step of filling in the erased portion of the burst transmission with soft value bits.

14. A method for coded transmission of data, comprising the step of:

generating a first and a second plurality of burst transmissions, wherein each burst transmission in the first and the second plurality of burst transmissions includes a first and a second code word interleaved therein, respectively;

deinterleaving the first plurality of burst transmissions to extract the first code word;

error decoding the extracted first code word to identify and correct errors within the code word;

identifying a bad burst transmission in the first plurality of burst transmissions by determining a burst transmission containing a majority of the errors;

erasing the bad burst transmission included in the first plurality of burst transmissions;

deinterleaving the second plurality of burst transmissions to extract the second code word, wherein the second plurality of burst transmission includes the erased bad burst transmission from the first plurality of burst transmissions; and error and erasure decoding the second code word.

15. The method of claim 14 wherein the step of identifying further comprises the step of finding burst transmissions having more than a threshold number of errors.

16. The method of claim 14 wherein the step of generating further includes the step of interleaving the first code word within the first plurality of burst transmissions.

17. A method for coded transmission of data, comprising the steps of:

receiving coded symbols;

comparing a received energy level for the coded symbols to a threshold signal strength level;

erasing coded symbols having a signal strength greater than the threshold signal strength level;

error and erasure decoding the received coded symbols; and oututting a received vector, including error and erasures, if an errors and erasures correction capability is exceeded for a particular code word.

18. The method of claim 17 further comprising the step of error decoding the coded symbols if no symbols have a signal strength exceeding the threshold signal strength level.

19. The method of claim 17 wherein the threshold level comprises a signal strength of neighboring symbols.

20. The method of claim 17 wherein the threshold level has a predetermined value.

21. A method for coded transmission of data, comprising the steps of:

recovering a first code word within a first plurality of burst transmissions;

error correction decoding the recovered first code word to correct errors within the code word;

identifying bad burst transmissions from a number of errors identified by the decoding;

erasing at least a portion of the burst transmissions identified as bad;

recovering a second code word from a second plurality of burst transmissions, wherein the second plurality of burst transmissions includes the erased burst transmission from the first plurality of burst transmissions; and error and erasure decoding the second code word;

outputting a received vector, including error and erasures, if an errors and erasures correction capability is exceeded for a particular code word.

22. A method for coded transmission of data, comprising the steps of:

recovering a first code word within a first plurality of burst transmissions wherein a burst transmission in the plurality of burst transmissions includes a code word repeated a plurality of times;

error correction decoding the recovered first code word to correct errors within the code word;

identifying bad burst transmissions from a number of errors identified by the decoding;

erasing at least a portion of the burst transmissions identified as bad;

recovering a second code word from a second plurality of burst transmissions, wherein the second plurality of burst transmissions includes the erased burst transmission from the first plurality of burst transmissions; and error and erasure decoding the second code word.

\* \* \* \* \*